(12) United States Patent
Zhang et al.

(10) Patent No.: US 11,462,706 B2
(45) Date of Patent: Oct. 4, 2022

(54) QUANTUM DOT LIGHT EMITTING DIODE AND METHOD FOR MANUFACTURING THE SAME, AND DISPLAY PANEL

(71) Applicant: BOE TECHNOLOGY GROUP CO., LTD., Beijing (CN)

(72) Inventors: Xin Zhang, Beijing (CN); Haizheng Zhong, Beijing (CN); Shuai Chang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 295 days.

(21) Appl. No.: 16/617,891

(22) PCT Filed: Jan. 29, 2019

(86) PCT No.: PCT/CN2019/073683
§ 371 (c)(1),
(2) Date: Nov. 27, 2019

(87) PCT Pub. No.: WO2019/227960
PCT Pub. Date: Dec. 5, 2019

(65) Prior Publication Data
US 2021/0359241 A1   Nov. 18, 2021

(30) Foreign Application Priority Data
May 31, 2018 (CN) .......................... 201810551297.9

(51) Int. Cl.
*H01L 51/50* (2006.01)
*H01L 51/56* (2006.01)

(52) U.S. Cl.
CPC ...... *H01L 51/5072* (2013.01); *H01L 51/5056* (2013.01); *H01L 51/56* (2013.01)

(58) Field of Classification Search
CPC . H01L 51/5072; H01L 51/5056; H01L 51/56; H01L 51/502; H01L 2251/5369; H01L 27/32
See application file for complete search history.

(56) References Cited

U.S. PATENT DOCUMENTS 8,148,891 B2   4/2012  Tung et al.
9,379,344 B2   6/2016  Yang
(Continued)

FOREIGN PATENT DOCUMENTS

CN   101278419 A   10/2008
CN   103730584 A   4/2014
(Continued)

OTHER PUBLICATIONS

First Office Action dated May 29, 2019 for corresponding Chinese application 201810551297.9.
(Continued)

*Primary Examiner* — Kyoung Lee
*Assistant Examiner* — Christina A Sylvia
(74) *Attorney, Agent, or Firm* — Nath, Goldberg & Meyer; Joshua B. Goldberg

(57) ABSTRACT

Disclosed belongs to the technical field of displaying, and relates to a quantum dot light emitting diode and a method for manufacturing the same, and a display panel. The method for manufacturing the quantum dot light emitting diode comprises steps of forming a cathode, an electron transport layer doping a substance capable of trapping current carriers comprising a N-type metal oxide and a quantum dot material with a surface ligand comprising a hydroxyl group, a light emitting layer, a hole transport layer and an anode. The quantum dot light emitting diode can effectively reduce the electron transport or injection by incorporating a substance capable of trapping current carri- (Continued)

ers, and therefore significantly improve the luminous efficiency. Meanwhile, the PEDOT:PSS with high conductivity is used as the transparent anode, and thus the whole structure may be manufactured totally by using solution processes at low cost and without high vacuum coating machines.

16 Claims, 4 Drawing Sheets

(56) References Cited

U.S. PATENT DOCUMENTS

| | | | |
|---|---|---|---|
| 2015/0076469 A1 | 3/2015 | Ikemizu et al. | |
| 2019/0103571 A1* | 4/2019 | Dong | H01L 33/14 |
| 2019/0119569 A1* | 4/2019 | Lee | C01B 19/007 |
| 2020/0035764 A1* | 1/2020 | Chang | H01L 51/52 |
| 2020/0291251 A1* | 9/2020 | Pan | C09D 11/033 |
| 2020/0343489 A1* | 10/2020 | Park | H01L 51/56 |

FOREIGN PATENT DOCUMENTS

| | | | | |
|---|---|---|---|---|
| CN | 103904178 A | 7/2014 | | |
| CN | 106098956 A | 11/2016 | | |
| CN | 106159109 A | 11/2016 | | |
| CN | 106450013 A | 2/2017 | | |
| CN | 106634948 A | 5/2017 | | |
| CN | 106654026 A | 5/2017 | | |
| CN | 107785496 A | 3/2018 | | |
| CN | 108767129 A | 11/2018 | | |
| CN | 108987601 A | * 12/2018 | ......... | H01L 27/3227 |

OTHER PUBLICATIONS

Second Office Action dated Jan. 21, 2020 for corresponding Chinese application 201810551297.9.

Ji, W. et al., "Highly Efficient and Low Turn-On Voltage Quantum Dot Light-Emitting Diodes by Using a Stepwise Hole-Transport Layer", ACS Applied Materials & Interfaces, 2015, vol. 7, pp. 15955-15960.

Chang, Sh. et al., "Alcohol-Soluble Quantum Dots: Enhanced Solution Processability and Charge Injection for Electroluminescence Devices", IEEE Journal of Selected Topics in Quantum Electronics, vol. 23, No. 5, Sep./Oct. 2017, pp. 1900708.

Dai, X. et al., "Solution-processed, high-performance light-emitting diodes based on quantum dots", Nature, Nov. 6, 2014, vol. 515, pp. 96-99.

Third Office Action dated Jul. 15, 2020, for corresponding Chinese application 201810551297.9.

* cited by examiner

QUANTUM DOT LIGHT EMITTING DIODE AND METHOD FOR MANUFACTURING THE SAME, AND DISPLAY PANEL

CROSS REFERENCE TO THE RELATED APPLICATION

This is a National Phase Application filed under 35 U.S.C. 371 as a national stage of PCT/CN2019/073683, filed Jan. 29, 2019, an application claiming the benefit of Chinese Patent Application No. 201810551297.9 entitled "Quantum dot light emitting diode and method for manufacturing the same, and display panel" filed on May 31, 2018, the entire content of each of which is incorporated herein by reference.

TECHNICAL FIELD

The present disclosure belongs to the technical field of displaying, and particularly relates to a quantum dot light emitting diode and method for manufacturing the same, and a display panel.

BACKGROUND ART

Quantum dot light emitting diodes (QLEDs) provide the advantages of low energy consumption, high luminance, high color purity, and flexibility, which are the key devices of the next generation display technology. In particular, the cathode of an inverted QLED can be directly connected to the drain electrode of a thin film transistor (TFT, serving as a control device), and thus the inverted QLED is currently the most promising device for commercial.

SUMMARY

The present disclosure provides a quantum dot light emitting diode comprising a cathode, an electron transport layer, a light emitting layer, a hole transport layer, and an anode stacked in sequence, wherein the electron transport layer comprises a substance capable of trapping current carriers, and the substance capable of trapping current carriers comprises an N-type metal oxide and a quantum dot material with a surface ligand comprising a hydroxyl group.

Optionally, the N-type metal oxide is any one or more selected from ZnO, ZnMgO, and $TiO_2$, and the quantum dot material with a surface ligand comprising a hydroxyl group is any one or more selected from CdSe-MCH, CdZnSeS and $CuInS_2$-MCH which have 6-mercaptohexanol as the surface ligand.

Optionally, the anode is made of a transparent conductive material with high conductivity, which includes poly 3,4-ethylene dioxythiophene:polystyrene sulfonate (PEDOT:PSS).

The present disclosure further provides a method for manufacturing the quantum dot light emitting diode described above, comprising the steps of forming a cathode, an electron transport layer, a light emitting layer, a hole transport layer, and an anode, wherein the electron transport layer comprises a substance capable of trapping current carriers, and the substance capable of trapping current carriers comprises an N-type metal oxide and a quantum dot material with a surface ligand comprising a hydroxyl group.

Optionally, forming an electron transport layer comprises the following steps:
dispersing an N-type metal oxide and a quantum dot material with a surface ligand comprising a hydroxyl group M an alcohol solvent to prepare an precursor solution for the electron transport layer; and
forming the electron transport layer by a solution process.

Optionally, the N-type metal oxide is any one or more selected from ZnO, ZnMgO, and $TiO_2$, and the quantum dot material with a surface ligand comprising a hydroxyl group is any one or more selected from. CdSe-MCH, CdZnSeS and $CuInS_2$-MCH which have 6-mercaptohexanol as the surface ligand.

Optionally, the light emitting layer and the hole transport layer are formed by a solution process, comprising:
preparing precursor solutions for the light emitting layer and the hole transport layer, respectively; and
forming the light emitting layer and the hole transport layer respectively solution processes.

Optionally, preparing a precursor solution for the light emitting layer comprises:
dispersing a quantum dot material in an alcohol solvent to form the precursor solution for the light emitting layer.

Optionally, the quantum dot material for preparing the light emitting layer is any one or more selected from CdSe, $CuInS_2$, and perovskite quantum dots.

Optionally, preparing a precursor solution for the hole transport layer comprises:
dispersing a P-type small organic molecule or a P-type metal oxide in a benzene-based solvent to form the precursor solution for the hole transport layer.

Optionally, the P-type small organic molecule or the P-type metal oxide is any one or more selected from PVK, Poly-TPD, TFB, and NiOx. The benzene-based solvent is chlorobenzene.

Optionally, forming the anode comprises;
adding polyethylene glycol to a transparent conductive material with high conductivity to form a precursor solution for the anode; and
forming the anode by a solution process.

Optionally, the transparent conductive material with high conductivity is poly 3,4-ethylene dioxythiophene:polystyrene sulfonate (PEDOT:PSS).

Optionally, the method further comprises filtering the precursor solution for each layer prior to the solution process, respectively.

Optionally, the solution process comprises:
applying the precursor solution for each layer by any one of spin coating, transfer printing, and inkjet printing to form a coating; and
annealing the coating of the precursor solution to form the corresponding layer.

The present disclosure further provides a display panel comprising the quantum dot light emitting diode described above.

DETAILED DESCRIPTION OF THE EMBODIMENTS

Currently, in quantum dot light emitting diodes, the energy level barrier between the electron transport layer and the light emitting layer (>0.5 eV) is lower than that between the hole transport layer and the light emitting layer (>1 eV). Due to the limitation of the energy level barrier between the layers, quantum dot light emitting diodes generally have a problem that the electron injection rate is higher than the hole injection rate, which seriously restricts the improvement of the luminous efficiency of the diodes.

There are two known ways to solve this problem: one is to slow down the electron injection by adding an insulating material such as polymethyl methacrylate (PMMA) between the electron transport layer and the light emitting layer, and the other is to accelerate the hole injection by incorporating an organic macromolecular material having a low HOMO energy level as a hole transport layer (reducing the hole injection barrier). Both of them introduce an additional layer to the original device, and the layer thickness is difficult to control with a poor repeatability, resulting in a more complicated process for manufacturing the device and an increased manufacture cost.

The present invention provides an inverted QLED with high luminous efficiency, which solves the technical problems described above.

In order to enable those skilled in the art better understand technical solutions of the present disclosure, the quantum dot light emitting diode and the method for manufacturing the same, and display panel according to the present disclosure will be further described in detail with reference to the accompanying drawings and specific embodiments below.

Figure 1:
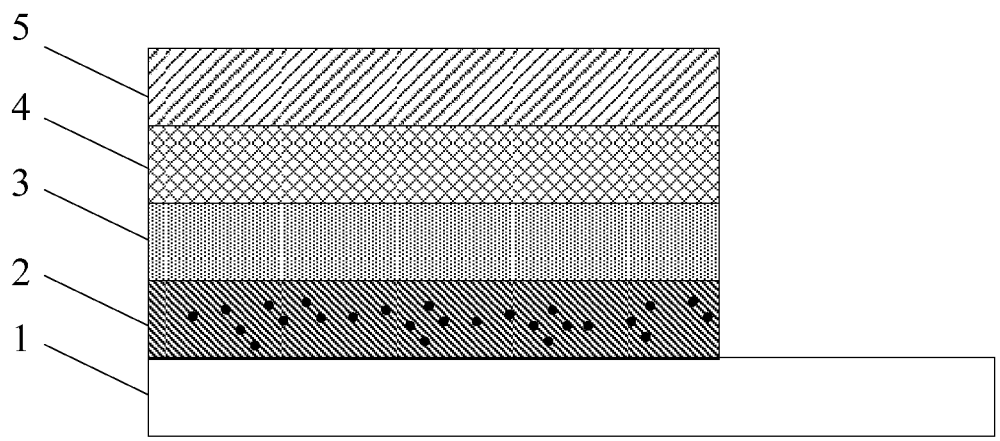
FIG. 1 schematically shows a structure diagram of the quantum dot light emitting diode according to an embodiment of the present disclosure.

Some embodiments of the present disclosure provide a quantum dot light emitting diode including a cathode, an electron transport layer, a light emitting layer, a hole transport layer, and an anode stacked in sequence, wherein the electron transport layer comprises a substance capable of trapping current carriers, and the substance capable of trapping current carriers comprises an N-type metal oxide and a quantum dot material with a surface ligand comprising a hydroxyl group. As shown in FIG. 1, the quantum dot light emitting diode has an inverted structure with top-emitting, comprising a cathode 1, an electron transport layer 2, a light emitting layer 3, a hole transport layer 4 and an anode 5 stacked in sequence. The electron transport layer 2 comprises a substance capable of trapping current carriers, and the substance capable of trapping current carriers comprises an N-type metal oxide and a quantum dot material with a surface ligand comprising a hydroxyl group.

The N-type metal oxide is any one or more selected from ZnO, ZnMgO and $TiO_2$, and the quantum dot material with a surface ligand comprising a hydroxyl group is any one or more selected from CdSe-MCH, CdZnSeS and $CuInS_2$-MCH which have 6-mercaptohexanol as the surface ligand.

The anode is made of a transparent conductive material with highly conductive, such as PEDOT:PSS PH1000.

Some embodiments of the present disclosure also provide a method for manufacturing the quantum dot light emitting diode, which comprises a step of preparing an electron transport layer comprising a substance capable of trapping current carriers.

The electron transport layer may be prepared by a solution process such as spin coating, transfer printing, ink jet printing or the like. When the quantum dot light emitting diode is prepared totally by solution processes, the method comprises the following steps:

S1): pretreating a substrate using as the cathode;

S2): pretreating materials for forming each of the layers to provide the precursor solutions for the layers; and S3): forming the layers sequentially with each precursor solution by a solution process.

In step S1), a conductive metal such as ITO, FTO or the like may be employed as the cathode, and the pretreatment includes cleaning and plasma treatment.

In step S2), materials for forming the electron transport layer, the light emitting layer, the hole transport layer, and the anode are pretreated respectively.

An N-type metal oxide such as ZnO, ZnMgO, $TiO_2$ and the like; or a quantum dot material with a surface ligand comprising a hydroxyl group, such as CdSe-MCH or $CuInS_2$-MCH having 6-mercaptohexanol as the surface ligand, may be employed to form the electron transport layer 2.

A quantum dot material, such as CdSe, $CuInS_2$, perovskite quantum dots and the like, may be employed to form the light emitting layer 3.

A P-type small organic molecule or a P-type metal oxide such as PVK, Poly-TPD, TFB, NiOx and the like may be employed to form the hole transport layer 4.

A transparent conductive material with highly conductive such as PEDOT:PSS may be employed to form the anode 5.

The pretreatment of the materials for forming the electron transport layer comprises dissolving the N-type metal oxide and/or the quantum dot material with a surface ligand comprising a hydroxyl group in a solvent, and subjecting the resulting solution to ultrasonication, centrifugation and filtration.

For example, 200-800 mg of the N-type metal oxide and 10-50 mg of the quantum dot material with a surface ligand comprising a hydroxyl group are dispersed in an appropriate amount of an alcohol solvent, and then the resulting solution is subjected to ultrasonic treatment for 10 min, followed by centrifugation at 3000-7000 rpm for 3-5 min, and finally filtering with a filter having a 0.22 µm filter head, so as to provide a precursor solution for the electron transport layer.

Ultrasonic treatment and centrifugation ensure a uniform dispersion of the quantum dot material in the solution. Filtration can remove large particles in the precursor solution that affect the quality of the electron transport layer.

The materials for forming the light emitting layer, the hole transport layer, and the anode may be pretreated using techniques known in the art. In some embodiments, the material for forming the anode may be PEDOT:PSS.

For example, as for the pretreatment of the material for forming the light emitting layer, 50-150 mg of the quantum dot material may be dispersed in an alcohol solvent such as ethanol; and then subjected to ultrasonic treatment for 10-20 min, followed by centrifugation at a rate of 3000-7000 rpm for 3-5 min, and finally filtering with a filter having a 0.22 µm filter head, so as to provide a precursor solution for the light emitting layer. The filtration was carried out to ensure no large particles in the precursor solution, otherwise which will affect the quality of the light emitting layer.

As for the pretreatment of the materials for forming the hole transport layer, 50-150 mg of the P-type small organic molecule or the P-type metal oxide may be dispersed in a benzene-based solvent such as chlorobenzene, and then subjected to ultrasonic treatment or stirring for 30-60 min, wherein the P-type small organic molecule or P-type metal oxide includes PVK, Poly-TPD, TFB, NiOx, and the like. After the stirring, the mixture was centrifuged at 3000-6000 rpm for 3-5 minutes to provide a precursor solution for forming the hole transport layer. After the centrifugation, the filtration was carried out with a filter having a 0.22 μm filter head so as to ensure that large particles in the precursor solution are filtered out, otherwise which will affect the quality of the hole transport layer.

For the pretreatment of the material for forming the anode, 20 μL of polyethylene glycol (PEG) may be added to 4 mL of PEDOT:PSS PH1000 and stirred for 24 h to provide a precursor solution for the anode. After the stirring treatment, the filtration was carried out with a filter having a 0.45 μm filter head so as to ensure that large particles in the precursor solution are filtered out, otherwise which will affect the quality of the anode.

In step S3), the precursor solutions is firstly applied by any one of spin coating, transfer printing, inkjet printing and the like; and then it is cured to form the corresponding layers, thereby obtaining the inverted quantum dot light emitting diode with top-emitting.

The electron transport layer may be prepared as follows:
an appropriate amount of the precursor solution for the electron transport layer is dropped on the substrate by using a pipetting gun, and spin-coated uniformly with a spin coating rate of 2000 to 4000 rpm (for example, 3000 rpm) for 40 to 60 s (for example, 50 s); and then the resulting coating is annealed at an annealing temperature of 80 to 120° C. (for example, 100° C.) and an annealing treatment time of 10 to 40 min (for example, 20 min or 30 min) to form the electron transport layer.

The amount of the precursor solution for spin coating depends on the substrate's area and the coating thickness, and the coating thickness of the precursor solution may be 30-200 nm (for example, 40 nm, 60 nm, 80 nm, 120 nm, 140 nm and 180 nm).

The light emitting layer, the hole transport layer and the anode may be prepared using techniques known in the art.

For example, for the light emitting layer, an appropriate amount of the precursor solution for the light emitting layer may be measured with a pipette and uniformly dropped onto the substrate on which the electron transport layer has been formed; and then the precursor solution is span by a homogenizer at 2000-5000 rpm for 30-60 s and annealed after the spin coating at 70-90° C. for 5-30 min to form the light emitting layer.

For the hole transport layer, an appropriate amount of the precursor solution for the hole transport layer may be measured with a pipette and uniformly dropped onto the substrate on which the electron transport layer and the light emitting layer have been formed, and then the precursor solution is span by a homogenizer at 4000-6000 rpm for 40-60 s and annealed after the spin coating at 100-180° C. for 10-60 min to form the hole transport layer.

The anode may be prepared by a spin coating process or a transfer printing process. When the anode is prepared by a spin coating process, an appropriate amount of the precursor solution for the anode may be measured with a pipette and uniformly dropped onto a substrate on which an electron transport layer, a light emitting layer and a hole transport layer have been framed, and then the precursor solution is span by a homogenizer at 2000-7000 rpm for 30-60 s and annealed after the spin coating at 100-200° C. for 10-50 min to form the anode. The anode prepared by the spin coating process does not need post-treatment and is simple to operate and high in repeatability.

Figure 4:
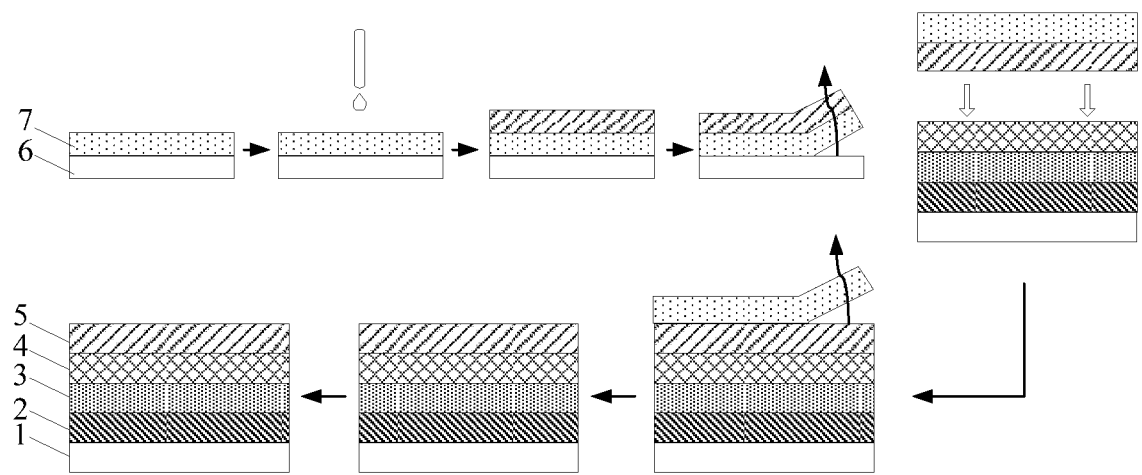
FIG. 4 schematically shows a flow chart of a process for manufacturing the quantum dot light emitting diode according to an embodiment of the present disclosure.

When the anode is prepared by a transfer printing process, the anode layer may be transferred to the substrate by a PDMS medium. Specifically, the transfer printing process may include the following steps:

a) curing of a transfer printing medium layer: mixing two PDMS solutions in a ratio of 10:1 to 20:1 uniformly; defoaming for 20-40 min in a vacuum drying oven; pouring the PDMS mixed solution into a plastic culture dish, after the defoaming, to a thickness of 1-2 μm; and finally heating the culture dish on a hot plate at 100-150° C. for 60-120 min to provide a cured PDMS layer;

b) preparation of the anode: cutting the cured transfer printing medium layer described above into small squares of 20×20 to 30×30 mm and attaching the small squares to a slide 6 (as shown in FIG. 4) of 25×25 to 35×35 mm; placing the slide on a suction cup of a homogenizer; then uniformly dropping an appropriate amount of PEDOT:PSS onto the slide with a pipette and spinning it by using a homogenizer at 1000-2500 rpm for 25-60 s; standing for 2-8 min after the spinning and cutting the PDMS medium spin-coated with the PEDOT:PSS layer into a rectangle with a length of 6-10 mm and a width of 3-5 mm so as to provide the PEDOT:PSS anode layer; at the same time, treating the substrate spin-coated with the layers with plasma for 3-10 min to increase the wettability of each layer and then imprinting the PEDOT:PSS anode layer on the substrate spin-coated with the layers by using tweezers.

As for the quantum dot light emitting diode of the present disclosure, the luminous efficiency thereof can be improved by slowing down the electron transport or injection to achieve a balanced injection of electrons and holes due to the electron transport layer 2 comprising one or more substances capable of trapping current carriers. In addition, using the PEDOT:PSS PH1000 with high-conductivity as the transparent anode 5 make it possible to avoid using of a high vacuum coating machine, thereby saving the cost.

The present disclosure also provides a display panel comprising said quantum dot light emitting diode.

The display panel may be any product or component with a display function, such as a desktop computer, a tablet computer, a notebook computer, a mobile phone, a PDA, a GPS, a vehicle display, a projection display, a video camera, a digital camera, an electronic watch, a calculator, an electronic instrument, a meter, a liquid crystal panel, an electronic paper, a television, a display, a digital photo frame, a navigator and the like, and may be applied to many fields such as public display and virtual display.

EXAMPLE 1

In this example, a quantum dot light-emitting diode with top-emitting, having a structure as shown in FIG. 1, is prepared totally by solution processes as follows:

Step S1): pretreating a substrate serving as a cathode by cleaning and plasma treatment.

Cleaning:

The substrate made of ITO was wiped clean with the absorbent cotton containing detergent, and then washed with deionized water. The washed substrate is subjected to ultrasonic treatments sequentially in detergent water, deionized water, acetone and isopropanol for 15 minutes respectively. Such cleaning step was performed twice and finally the cleaned substrate was immersed in isopropanol for use.

Plasma Treatment:

The cleaned substrate was blown dry with nitrogen, and placed face up in the plasma cleaning chamber and treated for 5 min.

Step S2): pretreating the materials for forming each layer to provide the precursor solution for each layer.

Step S21): pretreatment of the material for forming the electron transport layer.

300 mg of N-type metal oxide ZnO and 20 mg of the quantum dot material Cd Se-MCH with a surface ligand comprising a hydroxyl group were dispersed in 10 mL of ethanol; and then subjected to ultrasonic treatment for 10 min and centrifuged at 5000 rpm for 4 min after the ultrasonication, so as to provide the precursor solution for the electron transport layer. After the centrifugation, the filtration was carried out by using a filter with a 0.22 μm filter head so as to ensure that large particles in the precursor solution for the electron transport layer are filtered out, otherwise which will affect the quality of the layer.

Step S22): pretreatment of the material for forming the light emitting layer.

50 mg of quantum dot CdSe was dispersed in 5 mL of ethanol; and then subjected to ultrasonic treatment for 15 min and centrifuged at 5000 rpm for 4 rain after the ultrasonication, so as to provide the precursor solution for the light emitting layer. After the centrifugation, the filtration was carried out by using a filter with a 0.22 μm filter head to ensure that large particles in the precursor solution for the light emitting layer are filtered out, otherwise which will affect the quality of the layer.

Step S23): pretreatment of the material for forming the hole transport layer.

80 mg of P-type small organic molecule TFB was dispersed in 10 mL of chlorobenzene; and then subjected to ultrasonic treatment or stirring for 30 min and centrifuged at 3000 rpm for 5 min after the stirring treatment, so as to provide the precursor solution for the hole transport layer. After the centrifugation, the filtration was carried out by using a filter with a 0.22 μm filter head to ensure that large particles in the hole transport layer film precursor solution are filtered out, otherwise which will affect the quality of the layer.

Step S24): pretreatment of the material for forming the anode film.

20 μL of polyethylene glycol (PEG) was added to 4 mL of PEDOT:PSS PH1000 (purchased from Wuhan Zhuoxin Technology Co., Ltd.) and then subjected to stirring for 24 hours to provide the precursor solution for the anode film. After the stirring treatment, the filtration was carried out with by using a filter with a 0.45 μm filter head so as to ensure that large particles in the anode film precursor solution are filtered out, otherwise which will affect the quality of the film.

Step S3): forming each layer sequentially with the above precursor solutions by solution processes.

Step S31): forming the electron transport layer.

The pretreated substrate was placed on the suction cup of the homogenizer, and 100 μL of the precursor solution for the electron transport layer was uniformly dropped on the substrate with a pipette and subjected to spin coating at 3000 rpm for 50 s. Then an annealing treatment was performed at 100° C. for 20 min after the spin coating min so as to form the electron transport layer 2.

Step S32): forming the light emitting layer.

The substrate with the electron transport layer 2 was placed on the suction cup of the homogenizer, and 100 μL of the precursor solution for the light emitting layer was uniformly dropped onto the substrate with a pipette and subjected to spin coating at 4000 rpm for 60 s. Then an annealing treatment was performed at 80° C. for 10 min after the spin coating so as to form the light emitting layer 3.

Step S33): firming the hole transport layer.

The substrate with the electron transport layer 2 and the light emitting layer 3 was placed on the suction cup of the homogenizer, and 80 μL of the precursor solution for hole transport layer was uniformly dropped onto the substrate with a pipette and subjected to spur coating at 5000 rpm for 60 s. Then an annealing treatment was performed at 150° C. for 30 min after the spin coating to form the hole transport layer 4.

Step S34): preparation of the anode.

The substrate formed with the electron transport layer 2, the light emitting layer 3 and the hole transport layer 4 was placed on the suction cup of the homogenizer, and 180 μL of the precursor solution for the anode was uniformly dropped onto the substrate with a pipette and subjected to spin coating at 5000 rpm for 60 s. Then an annealing treatment was performed at 170° C. for 20 min after the spin coating to form the anode 5.

The anode of the quantum dot light emitting diode prepared by spin coating or the like required no post-treatment and was simple to operate and high in repeatability.

The quantum dot light emitting diode was obtained by the above steps.

Figure 2:
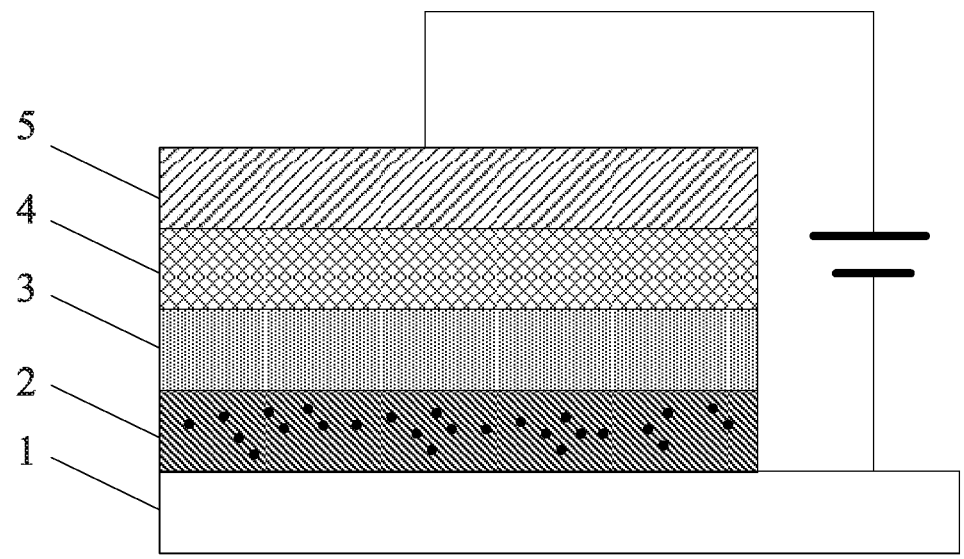
FIG. 2 schematically shows a testing diagram of the quantum dot light emitting diode according to Example 1 of the present disclosure.

The performance of the quantum dot light emitting diode was tested after the manufacture of the quantum dot light emitting diode. As shown in FIG. 2, in the test, a silver paste is applied to the edge of the pixels and the edge of the substrate (i.e. the non-display region of the substrate) to facilitate clamping of a fish mouth clamp during the test. The diode is loaded with a voltage of 0-10 V through a digital source meter. The current of the diode may be detected by a DC voltage and the current through the diode. The luminous efficiency of the diode is measured and calculated by using a PR-655 luminance meter. The results are shown in FIGS. 3(a) and (b).

Figure 3A:
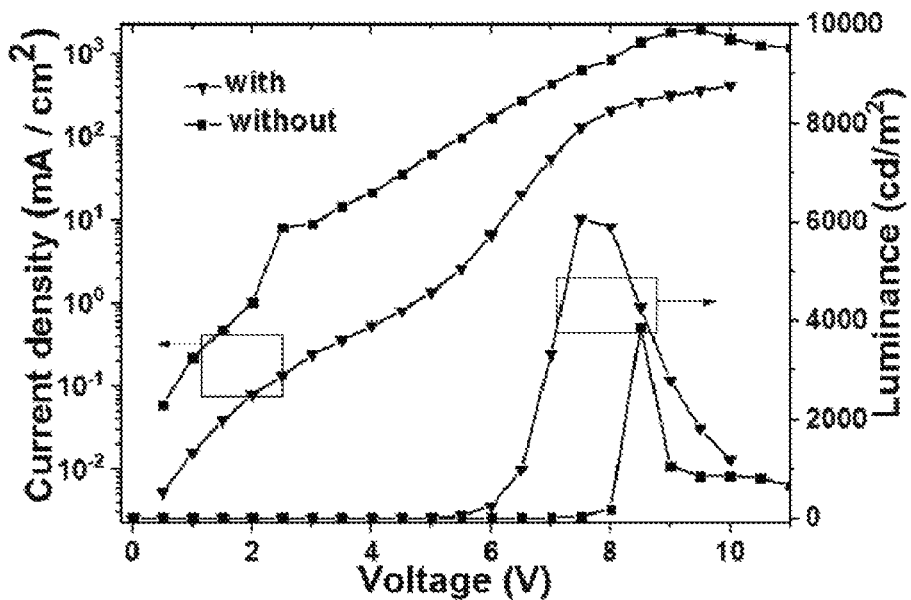
FIG. 3A shows a graph of the current density and the luminance as a function of voltage for the quantum dot light emitting diode according to Example 1 of the present disclosure.

FIG. 3(a) shows a graph of the current density and the luminance as a function of voltage of the quantum dot light emitting diode, with the ordinates being the luminance and the current density, and the abscissa being the voltage. The lines with triangles show the variations of the current density and the luminance of the quantum dot light emitting diode in which the electron transport layer 2 is doped with the quantum dot material. The lines with squares show the variations of the current density and the luminance of the quantum dot light emitting diode in which the electron transport layer 2 is not doped with the quantum dot material. As can be seen from FIG. 3(a), the quantum dot light emitting diode having the electron transport layer 2 doped with the quantum dot material (lines with triangles) presents a significantly lower current density than that of the quantum dot light emitting diode with no quantum dot material doped (lines with squares) at the same voltage. It can be seen that the electron injection is effectively reduced by doping the quantum dot material in the electron transport layer 2, and the maximum luminance of the quantum dot light emitting diode is significantly improved.

Figure 3B:
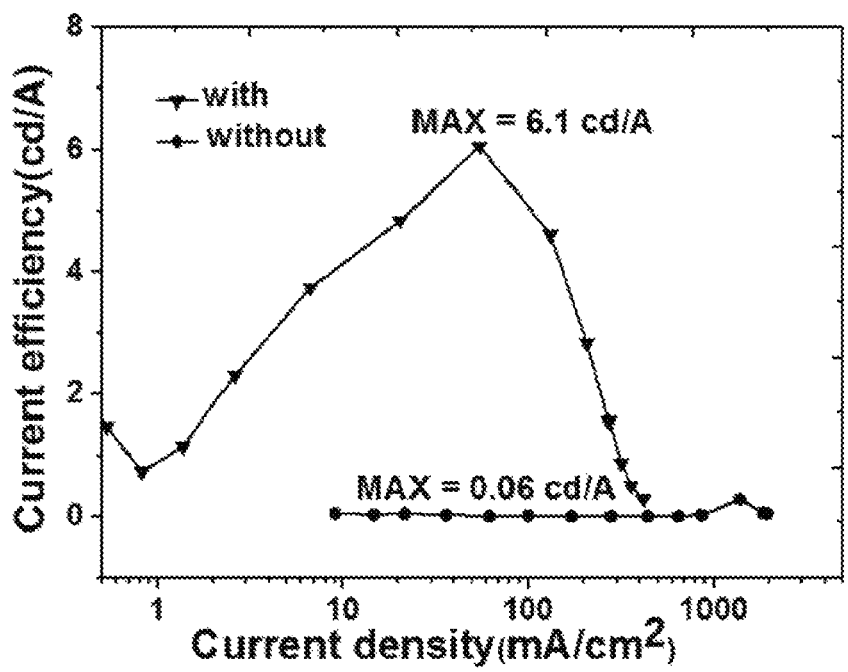
FIG. 3B shows a graph of the current efficiency as a function of current density for the quantum dot light emitting diode according to Example 1 of the present disclosure.

FIG. 3(b) shows a graph of the current efficiency as a function of current density of the quantum dot light emitting diode, with the ordinate being the current efficiency and the abscissa being the current density. It can be seen that, when the current density is the same, the current efficiency of the device having the electron transport layer 2 doped with the quantum dot material (lines with triangles) is significantly higher than that of the device having the electron transport layer 2 with no quantum dot material (lines with squares), and the maximum efficiency of the former quantum dot light emitting diode is 10 times higher than that of the latter quantum dot light emitting diode.

The quantum dot light emitting diode of the present example can effectively reduce the electron transport or injection by incorporating one or more substances capable of trapping current carriers into the electron transport layer 2, thereby significantly improve the device luminous efficiency of the quantum dot light emitting diode.

At the same time, the high conductivity PEDOT:PSS PH1000 is used as the transparent anode 5, and the whole structure is prepared totally by using solution processes. High vacuum coating machines are avoided and the manufacture cost is saved.

EXAMPLE 2

The present example is the same as Example 1, except for the preparation of the anode 5. In example 1, the PEDOT:PSS film was obtained by spin coating. In this example, the PEDOT:PSS film is transferred to the device through the PDMS intermediate medium by transfer printing.

For the manufacture of the quantum dot light emitting diode of the present example, pretreating the substrate and pretreating the materials for forming each layer as described in Example 1; and forming the electron transport layer 2, the light emitting layer 3 and the hole transport layer 4 by the solution process as described in Example 1.

As shown in FIG. 4, the preparation of the anode 5 comprises the following steps.

Curing the Transfer Printing Medium Layer 7:

The transfer printing medium layer 7 made of polydimethylsiloxane (PDMS) served as the transfer printing medium for the anode. Two kinds of PDMS solutions were uniformly mixed in a ratio of 10:1 and then the obtained mixture was subjected to defoaming in a vacuum drying oven for 30 min. After the defoaming, the PDMS solution was poured into a plastic culture dish to a thickness of 2 μm and heated on a hot plate at 120° C. for 80 min so as to provide a cured PDMS.

Forming the Anode 5:

The cured transfer printing medium layer 7 described above was cut into a small square with a size of 20×20 to 30×30 mm and then attached them to a slide 6 with a size of 25×25 to 35×35 mm (as shown in FIG. 4). The slide was placed on the suction cup of the homogenizer, and then an appropriate amount (for example, 180 μL) of PEDOT:PSS PH1000 was uniformly dropped onto the slide with a pipette and subjected to spin coating at 1500 rpm for 40 s. The slide was also treated with plasma for 5 min to increase the wettability. After the spin coating, it was allowed to stand for 4 min, and then the PDMS spin-coated with PEDOT:PSS PH1000 described above was cut into a rectangle with a length of 6-10 mm and a width of 3-5 mm, so as to form a PEDOT:PSS PH1000 anode layer, and then imprinted the anode layer on the substrate formed with each layer described above by using tweezers.

A layer of silver paste was applied to the edge of PEDOT:PSS PH1000 for clamping during the subsequent test. Preferably, a colloidal silver liquid may be applied on the anode for clamping during the test.

The quantum dot light emitting diode was loaded with a voltage of 0-10 V by a digital source meter to provide a diode current. The luminance of the quantum dot light emitting diode was measured by using a PR-655 luminance meter, and the luminous efficiency was calculated. The results are shown in FIGS. 5(a) and (b).

Figure 5A:
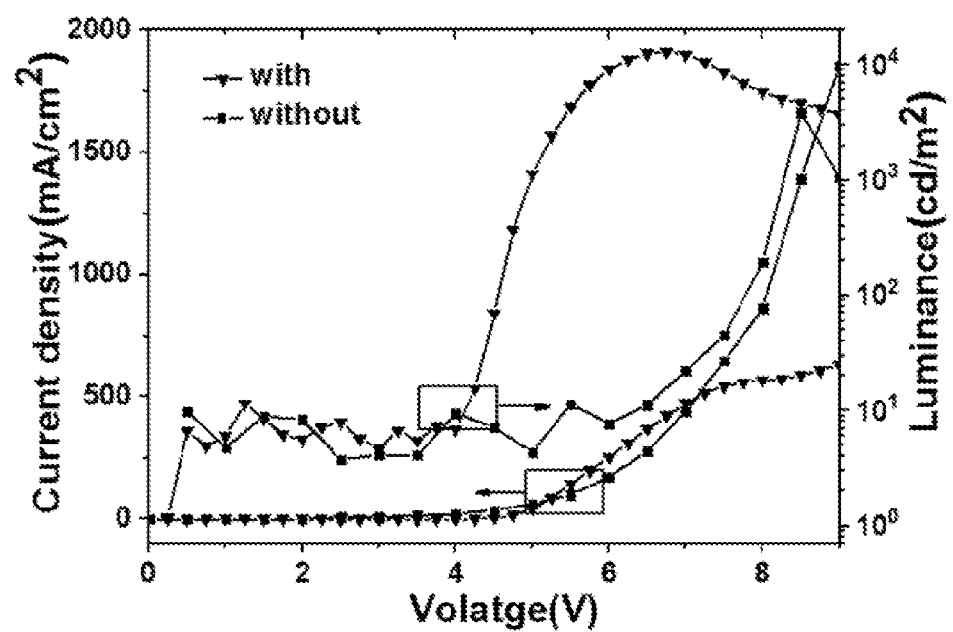
FIG. 5A shows a graph of the current density and the luminance as a function of voltage for the quantum dot light emitting diode according to Example 2 of the present disclosure.

FIG. 5(a) shows a graph of the current density and the luminance as a function of voltage of the quantum dot light emitting diode, with the ordinate being the luminance and the current density, and the abscissa being the voltage. The lines with triangles indicate the variations of the current density and the luminance of the quantum dot light emitting diode in which the electron transport layer 2 is doped with the quantum dot material. The lines with squares show the variations of the current density and the luminance of the quantum dot light emitting diode in which the electron transport layer 2 is not doped with the quantum dot material. As can be seen from FIG. 5(a), the quantum dot light emitting diode having the electron transport layer 2 doped with the quantum dot material (lines with triangles) presents a significantly lower current density than that of the quantum dot light emitting diode with no quantum dot material doped (lines with squares) at the same voltage. It can be seen that the electron injection is effectively reduced by doping the quantum dot material in the electron transport layer 2, and the maximum luminance of the quantum dot light emitting diode is increased from 1740 cd/m$^2$ to 1980 cd/m$^2$.

Figure 5B:
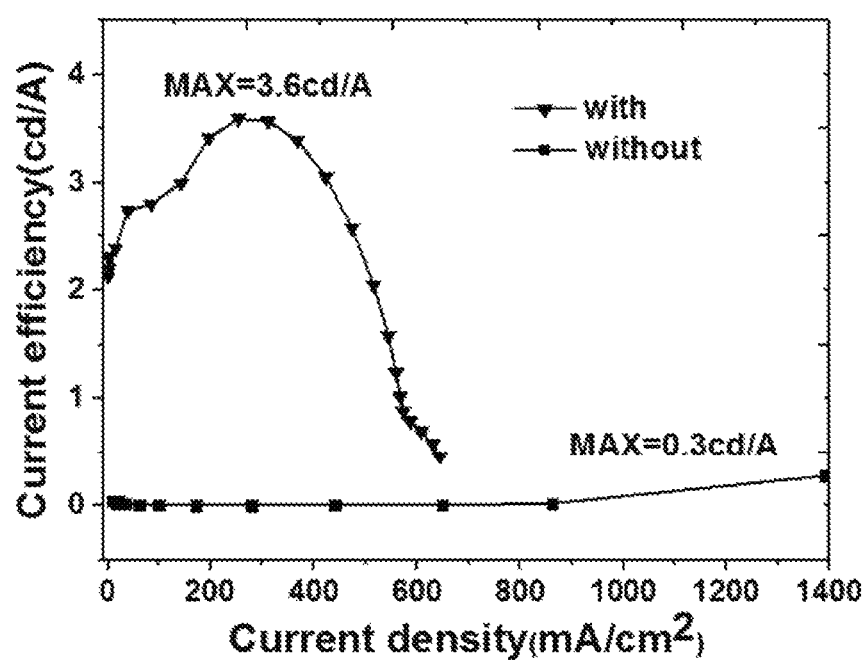
FIG. 5B shows a graph of the current efficiency as a function of current density for the quantum dot light emitting diode according to Example 2 of the present disclosure.

FIG. 5(b) shows a graph of the current efficiency as a function of current density of the quantum dot light emitting diode, with the ordinate being the current efficiency and the abscissa being the current density. It can be seen that, when the current density is the same, the current efficiency of the device having the electron transport layer 2 doped with the quantum dot material (lines with triangles) is significantly higher than that of the device having the electron transport layer 2 with no quantum dot material (lines with squares), and the maximum efficiency of the former quantum dot light emitting diode is 12 times higher than that of the latter quantum dot light emitting diode.

The quantum dot light-emitting diode of the present example can effectively reduce the electron injection by incorporating one or more substances capable of trapping current carriers in the electron transport layer 2, thereby significantly improve the device luminous efficiency of the quantum dot light emitting diode, and tend to provide high efficiency devices.

At the same time, compared to PEDOT:PSS 4083, which is commonly used in conventional quantum dot light emitting diodes, PEDOT:PSS PH1000 with high conductivity is employed in the present example as the transparent anode 5, and the whole structure are manufactured totally by solution processes. High vacuum coating machines are avoided, and the cost is saved.

It can be understood that the foregoing embodiments are merely illustrative embodiments employed for describing the principle of the present invention. However, the present invention is not limited thereto. For a person of ordinary skill in the art, various deformations and improvements can be made without departing from the spirit and essence of the present invention. These deformations and modifications shall fall into the protection scope of the present invention.

The invention claimed is:

1. A method for manufacturing a quantum dot light emitting diode, comprising steps of forming a cathode, an electron transport layer, a light emitting layer, a hole transport layer and an anode, wherein the electron transport layer comprises a substance capable of trapping current carriers, and the substance capable of trapping current carriers comprises a N-type metal oxide and a quantum dot material with a surface ligand comprising a hydroxyl group.

2. The method according to claim 1, comprising steps of:
dispersing an N-type metal oxide and a quantum dot material with a surface ligand comprising a hydroxyl group in an alcohol solvent to prepare a precursor solution for the electron transport layer; and
forming the electron transport layer by a solution process.

3. The method according to claim 2, wherein the N-type metal oxide is any one or more selected from ZnO, ZnMgO, and TiO2, and the quantum dot material with a surface ligand comprising a hydroxyl group is any one or more selected from CdSe-MCH, CdZnSeS, CuInS2-MCH which have 6-mercaptohexanol as the surface ligand.

4. The method according to claim 1, wherein the light emitting layer and the hole transport layer are formed by a solution process, comprising:
preparing precursor solutions for the light emitting layer and the hole transport layer, respectively; and
forming the light emitting layer and the hole transport layer respectively by a solution process.

5. The method according to claim 4, wherein preparing a precursor solution for the light emitting layer comprises:
dispersing the quantum dot material in an alcohol solvent to form the precursor solution for the light emitting layer.

6. The method according to claim 5, wherein the quantum dot material is any one or more selected from CdSe, CuInS2 and perovskite quantum dots.

7. The method according to claim 4, wherein preparing a precursor solution for the hole transport layer comprises:
dispersing a P-type small organic molecule or a P-type metal oxide in a benzene-based solvent to form the precursor solution for the hole transport layer.

8. The method according to claim 7, wherein the P-type small organic molecule or the P-type metal oxide is any one or more selected from PVK, Poly-TPD, TFB and NiOx, and the benzene-based solvent is chlorobenzene.

9. The method according to claim 1, wherein the step of forming the anode comprising:
adding polyethylene glycol to a transparent conductive material with high conductivity to form a precursor solution for the anode; and
forming the anode by a solution process.

10. The method according to claim 9, wherein the transparent conductive material with high conductivity is poly 3,4-ethylene dioxythiophene: polystyrene sulfonate (PEDOT:PSS).

11. The method according to claim 1, further comprising separately filtering precursor solutions for electron transport layer, light emitting layer and hole transport layer before a solution process respectively.

12. The method according to claim 1, wherein the solution process comprises:
forming layers of the precursor solutions for electron transport layer, light emitting layer and hole transport layer respectively by any one of a spin coating, a transfer printing and an inkjet printing; and
annealing the layers of the precursor solution to form corresponding each layer.

13. A quantum dot light emitting diode, comprising a cathode, an electron transport layer, a light emitting layer, a hole transport layer and an anode stacked in sequence, wherein the electron transport layer comprises a substance capable of trapping current carriers, and the substance capable of trapping current carriers comprises a N-type metal oxide and a quantum dot material with a surface ligand comprising a hydroxyl group.

14. The quantum dot light emitting diode according to claim 13, wherein the N-type metal oxide is any one or more selected from ZnO, ZnMgO, and TiO2, and the quantum dot material with a surface ligand comprising a hydroxyl group is any one or more selected from CdSe-MCH, CdZnSeS, CuInS2-MCH which have 6-mercaptohexanol as the surface ligand.

15. The quantum dot light emitting diode according to claim 13, wherein the anode is made of a transparent conductive material with high conductivity, and the high conductivity transparent conductive material is poly 3,4-ethylene dioxythiophene: polystyrene sulfonate (PEDOT:PSS).

16. A display panel, comprising the quantum dot light emitting diode of claim 13.

* * * * *